(12) United States Patent
Suzuki et al.

(10) Patent No.: US 8,753,717 B2
(45) Date of Patent: Jun. 17, 2014

(54) FILM FORMING METHOD AND FILM FORMING APPARATUS

(75) Inventors: Keisuke Suzuki, Nirasaki (JP); Kentaro Kadonaga, Nirasaki (JP); Yoshitaka Mori, Nirasaki (JP)

(73) Assignee: Tokyo Electron Limited (JP)

( * ) Notice: Subject to any disclaimer, the term of this patent is extended or adjusted under 35 U.S.C. 154(b) by 81 days.

(21) Appl. No.: 13/524,285

(22) Filed: Jun. 15, 2012

(65) Prior Publication Data

US 2012/0321791 A1 Dec. 20, 2012

(30) Foreign Application Priority Data

Jun. 16, 2011 (JP) .................................. 2011-134623
Apr. 6, 2012 (JP) .................................. 2012-087434

(51) Int. Cl.
*C23C 16/455* (2006.01)
*C23C 16/36* (2006.01)

(52) U.S. Cl.
USPC .................. 427/249.5; 427/249.1; 427/248.1

(58) Field of Classification Search
None
See application file for complete search history.

(56) References Cited

U.S. PATENT DOCUMENTS

2003/0201540 A1* 10/2003 Ahn et al. ...................... 257/760
2008/0213479 A1* 9/2008 Chou et al. .............. 427/255.393

FOREIGN PATENT DOCUMENTS

| JP | 2004047956 | 2/2004 |
| JP | 2006287194 | 10/2006 |
| JP | 2008227460 | 9/2008 |

* cited by examiner

*Primary Examiner* — Joseph Miller, Jr.
(74) *Attorney, Agent, or Firm* — Cantor Colburn LLP

(57) ABSTRACT

A film forming method for forming a thin film including boron, nitrogen, silicon, and carbon on a surface of a processing target by supplying a boron containing gas, a nitriding gas, a silane-based gas, and a hydrocarbon gas in a processing container in which the processing target is accommodated to be vacuum sucked includes: a first process which forms a BN film by performing a cycle of alternately and intermittently supplying the boron-containing gas and the nitriding gas once or more; and a second process which forms a SiCN film by performing a cycle of intermittently supplying the silane-based gas, the hydrocarbon gas, and the nitriding gas once or more. Accordingly, the thin film including boron, nitrogen, silicon, and carbon with a low-k dielectric constant, an improved wet-etching resistance, and a reduced leak current can be formed.

14 Claims, 12 Drawing Sheets

FIG. 7

| | BN FILM | SiCN FILM | RELATIVE DIELECTRIC CONSTANT | LEAK CURRENT | ETCHING AMOUNT |
|---|---|---|---|---|---|
| (BN)$_x$(SiCN)$_y$ | x | y | | | |
| (BN)$_2$(SiCN)$_1$ | 2 | 1 | 4.5 | SMALL | LARGE |
| (BN)$_1$(SiCN)$_2$ | 1 | 2 | 5.5 | LARGE | SMALL |

FILM FORMING METHOD AND FILM FORMING APPARATUS

CROSS-REFERENCE TO RELATED PATENT APPLICATIONS

This application claims the benefit of Japanese Patent Application No. 2011-134623, filed on Jun. 16, 2011 and Japanese Patent Application No. 2012-087434, filed on Apr. 6, 2012, in the Japanese Patent Office, the disclosure of which are incorporated herein in their entirety by reference.

BACKGROUND OF THE INVENTION

1. Field of the Invention

The present invention relates to a film forming method and a film forming apparatus for forming a thin film on a processing target such as a semiconductor wafer.

2. Description of the Related Art

In general, in order to manufacture a semiconductor integrated circuit, various processes such as a film forming process, an etching process, an oxidation process, a diffusion process, a surface modification process, a removal process of a natural oxidation film, and the like are performed on a semiconductor wafer formed of a silicon substrate or the like. The above processes may be performed in a single-wafer type processing apparatus that processes wafers one-by-one, or in a batch type processing apparatus that may process a plurality of wafers at once. For example, when the above processes are performed in an elongated, so-called batch type processing apparatus, semiconductor wafers are transferred from a cassette that can accommodate a plurality of semiconductor wafers, for example, 25 semiconductor wafers, to an elongated type wafer boat to be supported by the wafer boat in multiple stages.

On the wafer boat, for example, about 30 to 150 wafer sheets, the number of which may vary depending on sizes of the wafers, may be placed. The wafer boat is carried (loaded) in a processing container that can be exhausted, from a lower portion of the processing container, and the inside of the processing container is hermetically maintained. In addition, a predetermined heat treatment is performed while controlling various processing conditions such as a flow rate of a processing gas, a processing pressure, a processing temperature, and the like.

Here, as one of the factors for improving characteristics of a semiconductor integrated circuit, it is important to improve characteristics of an insulating film in the integrated circuit. In general, $SiO_2$, phosphosilicate glass (PSG), plasma silicon oxide (P—SiO), plasma silicon nitride (P—SiN), spin on glass (SOG), $Si_3N_4$ (silicon nitride film), or the like is used as the insulating film in the integrated circuit. In addition, the silicon nitride film, in particular, is generally used for various uses because an insulating characteristic of the silicon nitride film is superior to that of a silicon oxide film, and the silicon nitride film may sufficiently function as an etching stopper film or an interlayer insulation film.

In addition, recently, demands for developing low-k circuit devices and for improving resistance against etching have increased greatly in order to improve characteristics of a circuit device (here, k is dielectric constant). Under these circumstances, since an aimed treatment may be performed without exposing the wafers to such a high temperature in the elongated, so-called batch type processing apparatus, a method of repeatedly forming films of a single layer to a few layers at the atomic level or films of a single layer to a few layers at the molecular level while intermittently supplying a raw material gas has been suggested. The above film forming method is generally referred to as an atomic layer deposition (ALD) method.

For example, Patent Reference 1 discloses a film forming method for forming a film of a laminate structure of multiple layers by stacking silicon nitride (SiN) thin films and boron nitride (BN) films alternately in multiple layers by using a remote plasma atomic layer deposition (RP-ALD) method. In addition, Patent Reference 2 discloses a film forming method for forming a SiCN film by using an ALD method, in which carbon (C) that is useful for improving an etching resistance is added in a silicon nitride film through a heat treatment in order to achieve a low-k characteristic and to improve the etching resistance.

However, although the above-described silicon nitride-based insulating films are low-k insulating films and have superior resistance against an etching process compared to conventional insulating films formed as silicon nitride films, they still don't obtain required properties. In particular, a property with respect to a leak current in an insulating film is not enough.

PRIOR ART REFERENCE (Patent Reference 1) Japanese Laid-open Patent Publication No. 2004-047956

(Patent Reference 2) Japanese Laid-open Patent Publication No. 2008-227460

(Patent Reference 3) Japanese Laid-open Patent Publication No. 2006-287194

SUMMARY OF THE INVENTION

The present invention is created to address the above-described problems effectively. The present invention provides a film forming method and a film forming apparatus capable of forming a thin film (SiBCN film) including boron, nitrogen, silicon, and carbon for obtaining a low-k characteristic, improving an etching resistance, and reducing a leak current.

According to an aspect of the present invention, there is provided a film forming method for forming a thin film including boron, nitrogen, silicon, and carbon on a surface of a processing target by supplying a boron containing gas, a nitriding gas, a silane-based gas, and a hydrocarbon gas in a processing container in which the processing target is accommodated to be vacuum sucked, the film forming method including: a first process which forms a BN film by performing a cycle of alternately and intermittently supplying the boron-containing gas and the nitriding gas once or more; and a second process which forms a SiCN film by performing a cycle of intermittently supplying the silane-based gas, the hydrocarbon gas, and the nitriding gas once or more.

Accordingly, a thin film (SiBCN film) including boron, nitrogen, silicon, and carbon for obtaining a low-k characteristic, improving an etching resistance, and reducing a leak current may be formed.

According to another aspect of the present invention, a film forming apparatus for forming a predetermined thin film on a processing target, the film forming apparatus including: a processing container formed as a longitudinal cylinder capable of vacuum sucking; a holding unit which holds the processing target in multiple stages and is inserted into/escaped from the processing container; a heating unit which is provided on an outer circumference of the processing container; a silane-based gas supplying unit which supplies a silane-based gas into the processing container; a nitriding gas supplying unit which supplies a nitriding gas into the processing container; a boron-containing gas supplying unit which supplies a boron-containing gas into the processing container; a hydrocarbon gas supplying unit which supplies a hydrocarbon gas into the processing container; and a control unit which controls execution of the film forming method according to the aspect of the present invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 7 is a table showing film forming conditions according to the number of cycles and relative evaluation results of characteristics when a SiBCN film is formed;

DETAILED DESCRIPTION OF THE INVENTION

Figure 1:
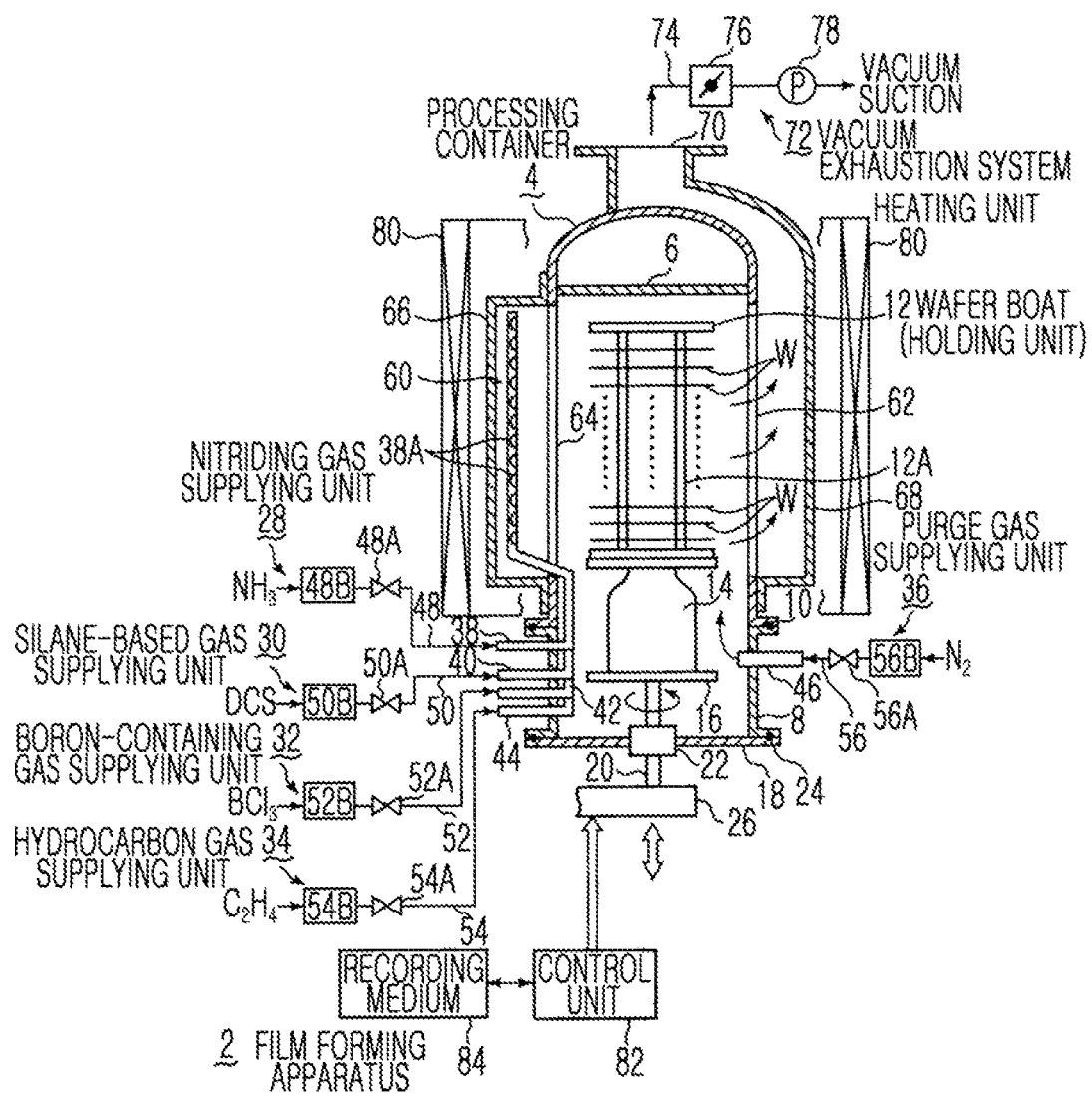
FIG. 1 is a longitudinal sectional view of a film forming apparatus according to an embodiment of the present invention.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 2:
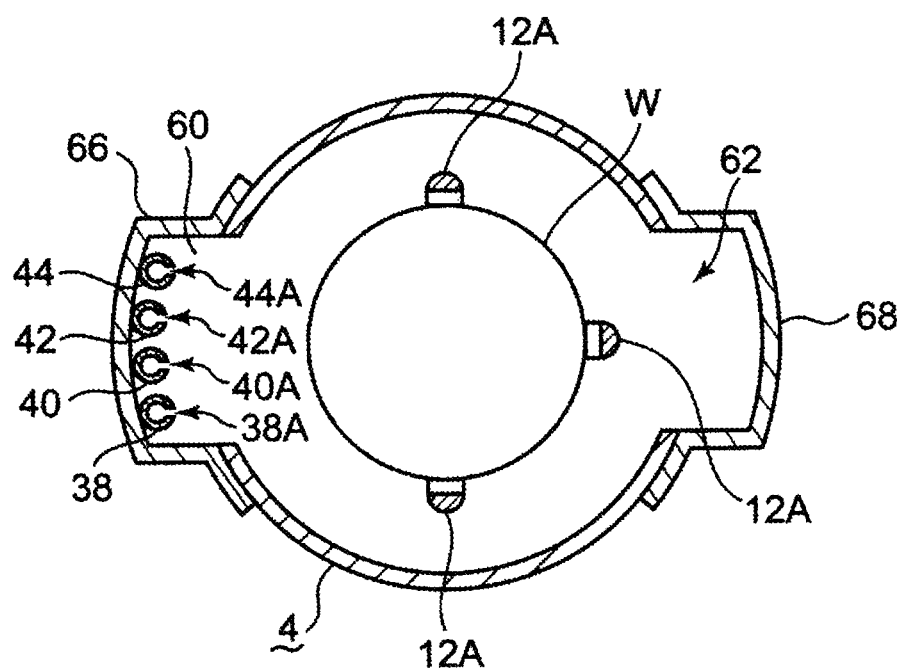
FIG. 2 is a cross-sectional view of the film forming apparatus (a heating unit is omitted)

Hereinafter, the present invention will be described in detail by explaining exemplary embodiments of the invention with reference to the attached drawings. FIG. 1 is a longitudinal sectional view of a film forming apparatus 2 according to an embodiment of the present invention, and FIG. 2 is a cross-sectional view of the film forming apparatus 2 (a heating unit is omitted). In addition, a case where a thin film including boron, nitrogen, silicon, and carbon, that is, a SiBCN film (silicon nitride film including boron and carbon), is formed using dichlorosilane (DCS) as a silane-based gas, an ammonia gas ($NH_3$) as a nitriding gas, a $BCl_3$ gas as a boron-containing gas, and a $C_2H_4$ gas (ethylene gas) as a hydrocarbon gas will be described as an example.

As shown in FIGS. 1 and 2, the film forming apparatus 2 includes a processing container 4 formed as a cylinder having an opened lower end and a ceiling. An entire body of the processing container 4 may be formed of, for example, quartz, and a ceiling plate 6 formed of quartz is hermetically provided on the ceiling of the processing container 4. In addition, a manifold 8 formed of, for example, a stainless steel cylinder, is connected to the lower opening of the processing container 4 via a sealing member 10 such as an O-ring. Otherwise, the film forming apparatus 2 may include a cylindrical processing container formed of quartz without forming the manifold 8 formed of stainless steel.

The manifold 8 supports a lower portion of the processing container 4. A wafer boat 12 that is formed of quartz and functions as a holding unit holding a plurality of processing targets, that is, semiconductor wafers W, in multiple stages is elevated to be freely inserted into/escaped from the processing container 4 from a lower portion of the manifold 8. According to the present embodiment, the wafer boat 12 includes pillars 12A that may support, for example, 50 to 100 semiconductor wafers W having a diameter of about 300 mm in multiple stages at constant pitches.

The wafer boat 12 is placed on a table 16 via a thermos tube 14 formed of quartz, and the table 16 is supported on a rotary shaft 20 penetrating a lid portion 18, formed of, for example, stainless steel, for opening/closing the lower opening of the manifold 8. In addition, a magnetic fluid seal 22, for example, is provided on a penetration portion of the rotary shaft 20 so as to rotatably support the rotary shaft 20 while sealing the rotary shaft 20 airtight. In addition, a sealing member 24 formed of, for example, an O-ring, is interposed between a peripheral portion of the lid portion 18 and the lower end portion of the manifold 8 in order to hold a sealing property in the processing container 4.

The rotary shaft 20 is attached to a leading end of an arm 26 supported by an elevation mechanism (not shown), for example, a boat elevator, so that the wafer boat 12, the lid portion 18, and the like are integrally elevated to be inserted into/escaped from the processing container 4. Otherwise, the table 16 may be fixed at the lid portion 18 side, and the wafers W may be processed without rotating the wafer boat 12.

In the manifold 8, a nitriding gas supplying unit 28 for supplying, for example, an ammonia ($NH_3$) gas, as a nitriding gas, a silane-based gas supplying unit 30 for supplying, for example, a DCS gas, as a silane-based gas that is a film forming gas, a boron-containing gas supplying unit 32 for supplying, for example, a $BCl_3$ gas, as a boron-containing gas, a hydrocarbon gas supplying unit 34 for supplying, for example, a $C_2H_4$ (ethylene) gas, as a hydrocarbon gas, and a purge gas supplying unit 36 for supplying an inert gas, for example, an $N_2$ gas, as a purge gas, into the processing container 4 are provided.

In more detail, the nitriding gas supplying unit 28 includes a gas distribution nozzle 38 formed of a quartz tube penetrating into the manifold 8 through a side wall of the manifold 8 and then being bent and extended upward. A plurality of gas injection holes 38A are formed in the gas distribution nozzle 38 at predetermined intervals in a length direction of the gas distribution nozzle 38, so that the ammonia gas may be evenly discharged from the gas injection holes 38A in a horizontal direction.

Likewise, the silane-based gas supplying unit 30 includes a gas distribution nozzle 40 formed of a quartz tube penetrating into the manifold 8 through the side wall of the manifold 8 and then being bent and extended upward. A plurality of gas injection holes 40A (refer to FIG. 2) are formed in the gas distribution nozzle 40 at predetermined intervals in a length direction of the gas distribution nozzle 40, so that the DCS gas that is the silane-based gas may be evenly discharged from the gas injection holes 40A in a horizontal direction.

Likewise, the boron-containing gas supplying unit 32 also includes a gas distribution nozzle 42 formed of a quartz tube penetrating into the manifold 8 through the side wall of the manifold 8 and then being bent and extended upward. A plurality of gas injection holes 42A (refer to FIG. 2) are formed in the gas distribution nozzle 42 at predetermined intervals in a length direction of the gas distribution nozzle 42, like in the gas distribution nozzle 40 for the silane-based gas, so that the $BCl_3$ gas may be evenly discharged from the gas injection holes 42A in a horizontal direction.

Likewise, the hydrocarbon gas supplying unit 34 also includes a gas distribution nozzle 44 formed of a quartz tube and penetrating into the manifold 8 through the side wall of the manifold 8 and then being bent and extended upward. A plurality of gas injection holes 44A (refer to FIG. 2) are formed in the gas distribution nozzle 44 at predetermined intervals in a length direction of the gas distribution nozzle 44, like in the gas distribution nozzle 40 for the silane-based gas, so that the $C_2H_4$ gas may be evenly discharged from the gas injection holes 44A in a horizontal direction.

Likewise, the purge gas supplying unit 36 includes a gas nozzle 46 that is provided to penetrate through the side wall of the manifold 8. Gas passages 48, 50, 52, 54, and 56 are respectively connected to the nozzles 38, 40, 42, 44, and 46. In addition, opening/closing valves 48A, 50A, 52A, 54A, and 56A and flow rate controllers 48B, 50B, 52B, 54B, and 56B such as mass flow controllers are provided respectively in the gas passages 48, 50, 52, 54, and 56 so that the $NH_3$ gas, the DCS gas, the $BCl_3$ gas, the $C_2H_4$ gas, and the $N_2$ gas may be supplied while flow rates thereof are controlled.

On the other hand, a nozzle accommodating concave portion 60 is formed on a part of a side wall of the processing container 4 along a height direction of the processing container 4, and an exhaust hole 62 for vacuum exhausting the processing container 4 is formed thin and long in a side opposite to the nozzle accommodating concave portion 60 in the processing container 4 by shaving off the side wall of the processing container 4 in, for example, an up-and-down direction. In more detail, the nozzle accommodating concave portion 60 may be formed by shaving off the side wall of the processing container 4 to a predetermined width along the up-and-down direction to form a thin and long opening 64, and welding a partition wall 66 formed of, for example, quartz, to be thin and long in the up-and-down direction and to have a concave cross-section hermetically onto an outer wall of the processing container 4 so as to cover the opening 64 from an outer portion of the opening 64.

Accordingly, a part of the side wall of the processing container 4 is recessed outward in a concave shape so that the nozzle accommodating concave portion 60 having a side opened to the inside of the processing container 4 to communicate with the processing container 4 may be integrally formed with the processing container 4. That is, an internal space of the partition wall 66 is integrally communicated with the inside of the processing container 4. The opening 64 may be sufficiently long in the up-and-down direction to cover all of the wafers W, which are held by the wafer boat 12, in a height direction. In addition, as shown in FIG. 2, the gas distribution nozzles 38, 40, 42, and 44 are provided in the nozzle accommodating concave portion 60 in parallel with each other.

On the other hand, an exhaust hole cover member 68 that is formed of quartz having a ⊐ (Japanese word)-shaped cross-section to cover the exhaust hole 62 is welded and attached to the exhaust hole 62 that is provided to oppose the opening 64. The exhaust hole cover member 68 extends upward along the side wall of the processing container 4, and defines a gas outlet 70 at an upper portion of the processing container 4. A vacuum exhaustion system 72 for performing vacuum suction of the inside of the processing container 4 is provided to the gas outlet 70. In more detail, the vacuum exhaustion system 72 includes an exhaust passage 74 connected to the gas outlet 70, and a pressure adjusting valve 76 that may be opened/closed and an opening degree of which may be adjustable and a vacuum pump 78 are sequentially provided in the exhaust passage 74. In addition, a heating unit 80 formed as a cylinder for heating the processing container 4 and the wafers W in the processing container 4 is provided to surround an outer circumference of the processing container 4.

In addition, all operations of the film forming apparatus 2 having the above structure may be controlled by a control unit 82 formed of, for example, a computer, and programs of the computer performing the operations are stored in a recording medium 84 such as a flexible disk, a compact disc (CD), a hard disk, or a flash memory. In more detail, according to commands from the control unit 82, start or stop supplying of each gas by the opening/closing operations of each opening/closing valve, flow rate controlling, controlling of the processing temperature or the processing pressure, and the like are performed.

In addition, the control unit 82 includes a user interface (not shown) connected thereto, and the user interface includes a keyboard, by which input/output manipulation of commands is performed by an operator in order to manage the apparatus, a display visibly displaying an operation status of an apparatus, or the like. In addition, communication for performing the above controlling operations may be performed with the control unit 82 via a communication wire.

Next, a film forming method (the so-called atomic layer deposition (ALD) film forming method) performed by using the film forming apparatus 2 having the above structure is described according to an embodiment of the present invention. In the film forming method of the present embodiment, a thin film (SiBCN film) of a laminated structure including boron, nitrogen, silicon, and carbon is formed by performing a first process for forming a BN film by performing a cycle of intermittently and alternately supplying a boron-containing gas and a nitriding gas once or more, and a second process of forming a SiCN film by performing a cycle of intermittently supplying a silane-based gas, a hydrocarbon gas, and a nitriding gas once or more.

First Embodiment of the Film Forming Method

Figure 3:
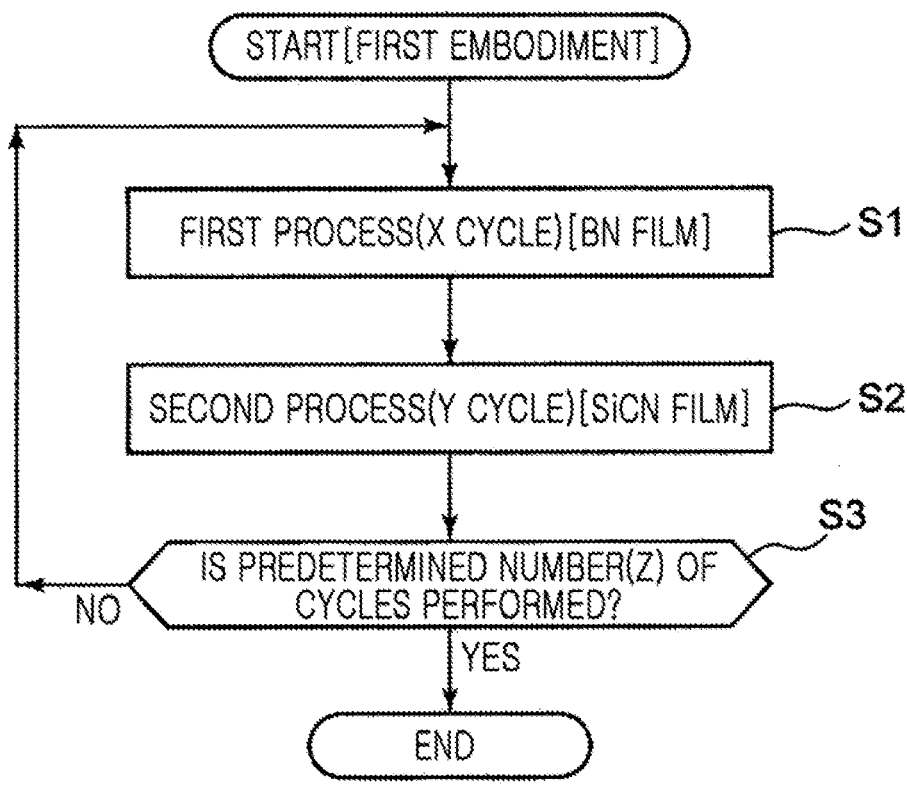
FIG. 3 is a flowchart showing a film forming method according to a first embodiment of the present invention.
Figure 4:
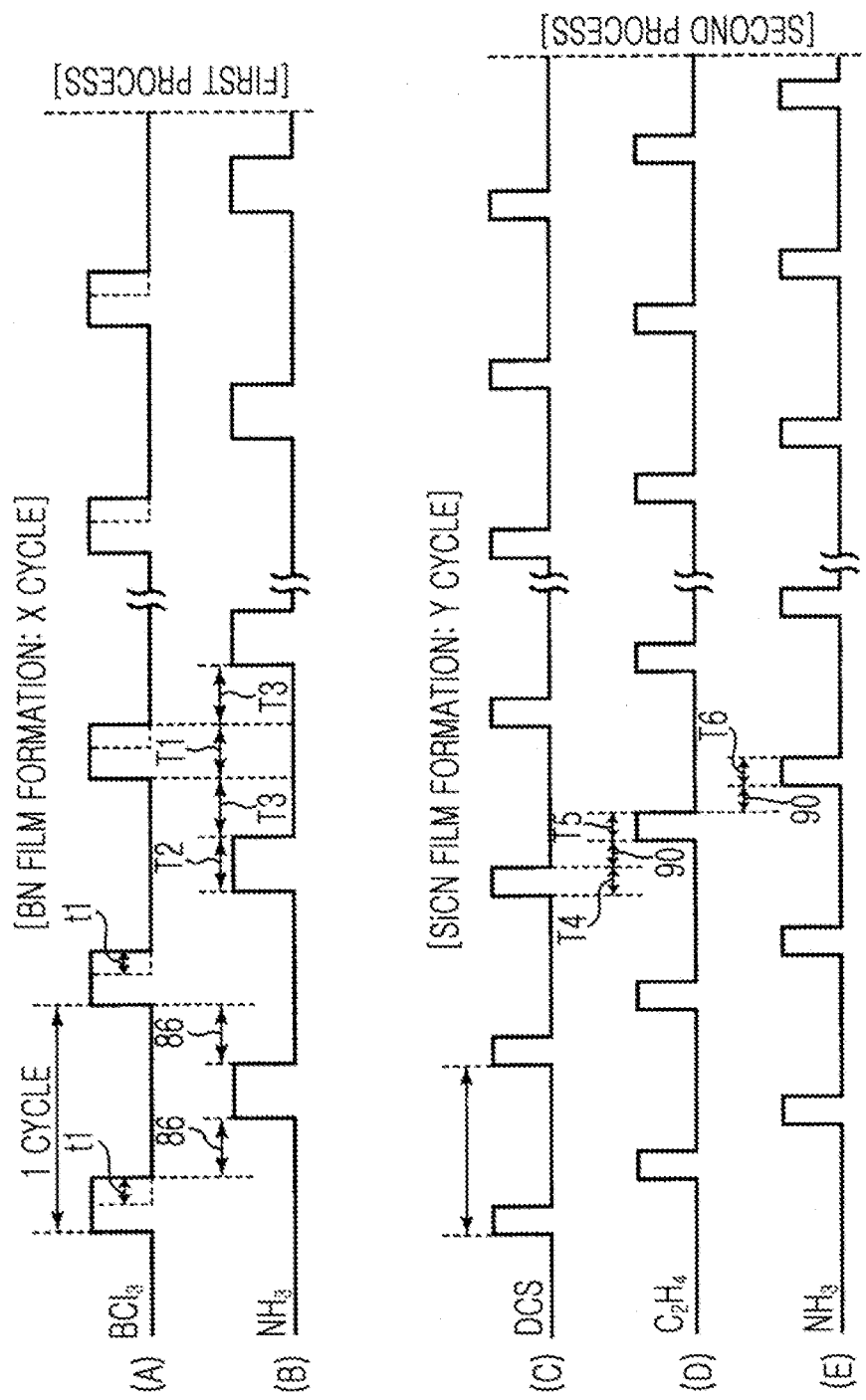
FIG. 4 is a timing chart showing timing of supplying various gases in the film forming method according to the first embodiment of the present invention.
Figure 5:
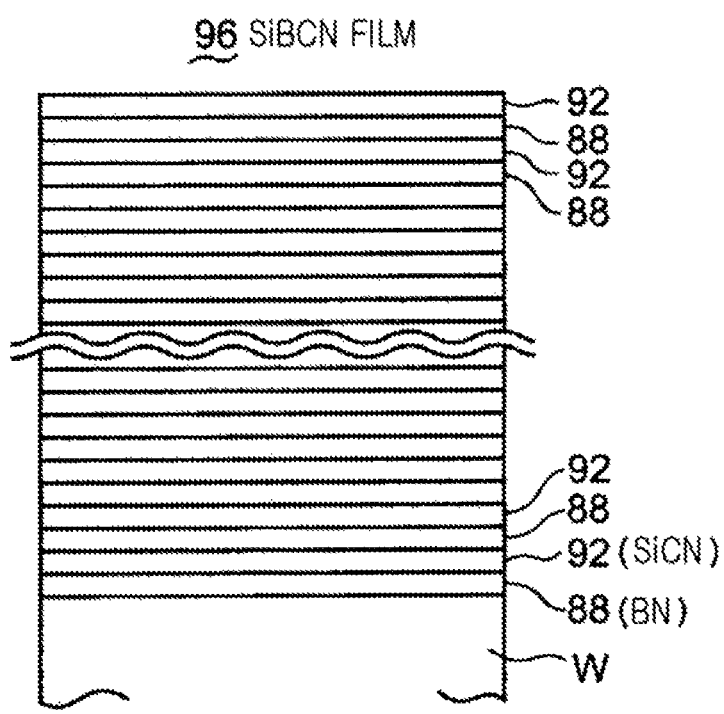
FIG. 5 is a cross-sectional view of a thin film having a laminated structure formed by the film forming method according to the first embodiment of the present invention.

First, the film forming method according to the first embodiment of the present invention will be described with reference to FIGS. 3 through 5. FIG. 3 is a flowchart for describing the film forming method according to the first embodiment of the present invention, FIG. 4 is a timing chart showing timing of supplying various gases in the film forming method according to the first embodiment of the present invention, and FIG. 5 is a cross-sectional view showing a thin film having a laminated structure formed by the film forming method according to the first embodiment of the present invention. First, the wafer boat 12 on which a plurality of, for example, 50 to 100, wafers W having a diameter of 300 mm are placed under room temperature is elevated to be loaded in the processing container 4 at a predetermined temperature from a lower portion of the processing container 4, and the lid portion 18 closes the lower opening of the manifold 8 to seal the processing container 4.

In addition, a vacuum suction of the inside of the processing container 4 is performed to maintain the inside of the processing container 4 at a predetermined processing pressure, and at the same time, a power supply to the heating unit 80 is increased to rise the temperature of the wafers W to maintain the processing temperature. The $BCl_3$ gas is supplied from the boron-containing gas supplying unit 32, the $NH_3$ gas is supplied from the nitriding gas supplying unit 28, the DCS gas is supplied from the silane-based gas supplying unit 30, and the $C_2H_4$ gas is supplied from the hydrocarbon gas supplying unit 34.

In more detail, the $BCl_3$ gas is discharged from each of the gas injection holes 42A of the gas distribution nozzle 42 in the horizontal direction, the $NH_3$ gas is discharged from each of the gas injection holes 38A of the gas distribution nozzle 38 in the horizontal direction, the DCS gas is discharged from each of the gas injection holes 40A of the gas distribution nozzle 40 in the horizontal direction, and the $C_2H_4$ gas is discharged from each of the gas injection holes 44A of the gas distribution nozzle 44 in the horizontal direction.

In more detail, as shown in FIGS. 3 through 5, a first process S1 for forming a BN film by performing a cycle of supplying the boron-containing gas and the nitriding gas intermittently and alternately once or more, and a second process S2 for forming a SiCN film by performing a cycle of supplying the silane-based gas, the hydrocarbon gas, and the nitriding gas intermittently once or more are performed repeatedly as many times as a predetermined number in the above-stated order. Here, between two adjacent supplying periods of each of the gases in time, a purging process for exhausting remaining gas in the processing container 4 may be performed. Otherwise, the purging process may be omitted. In addition, a period between the supplying processes that are adjacent in time for supplying the same gas becomes one cycle. Accordingly, the SiBCN thin film of the laminated structure is formed on surfaces of the wafers W that are supported by the wafer boat 12 that is rotating.

In more detail, in the first process S1 of the first embodiment, a vacuum suction of the inside of the processing container 4 is performed in advance, and in this state, the $BCl_3$ gas that is the boron-containing gas and the $NH_3$ gas that is the nitriding gas are alternately and intermittently supplied in the processing container 4 in a pulse form. One cycle is between the $BCl_3$ supplying process in an arbitrary pulse form and a next $BCl_3$ supplying process, and here, the cycle is performed repeatedly a plurality of time, for example, x times (x cycles). Here, x denotes an integer of 1 or greater. Between the $BCl_3$ gas supplying process (refer to FIG. 4(A)) and the $NH_3$ gas supplying process (refer to FIG. 4(B)), there is a pause period 86 in which the purging process is performed as described above, and thus, the remaining gas in the processing container 4 is exhausted in the purging process. The purging process may be performed by continuously performing the vacuum suction of the processing container 4 by using the vacuum exhaustion system 72 in a state where supply of all kinds of gases is stopped, by performing the vacuum suction of the processing container 4 while supplying a purge gas, or by combining the above two ways.

During the $BCl_3$ gas supplying process, $BCl_3$ gas molecules attach to surfaces of the wafers W, and then, when the $NH_3$ gas is supplied during the $NH_3$ gas supplying process, $NH_3$ reacts with the $BCl_3$ attached to the surfaces of the wafers W to generate boron nitride (BN). When x-cycles of the above processes are repeated, a BN film 88 is formed.

An example of a processing condition at this time is as follows: A period T1 of the $BCl_3$ supplying process is, for example, within a range of about 5 to 30 seconds, for example, about 30 seconds, a period T2 of the $NH_3$ supplying process is, for example, within a range of about 15 to 30 seconds, for example, about 20 seconds, and a period T3 of the pause period 86 in which the purging process is performed is, for example, about 1 to 10 seconds, for example, about 8 seconds.

In addition, a flow rate of the $BCl_3$ gas is about, for example, 1000 sccm, and a flow rate of the $NH_3$ gas is about, for example, 10000 sccm. In addition, the processing temperature is in a range of about, for example, 500 to 700° C. In this case, if the processing temperature is lower than 500° C., the film forming reaction does not sufficiently occur, and moreover, a film forming rate is excessively low. In addition, if the processing temperature is higher than 700° C., various films formed on lower layers are degraded. Here, a more desirable processing temperature is in a range of 550 to 630° C.

Also, in the present embodiment, when each of the gases is supplied, an atmosphere in the processing container 4 is continuously exhausted. However, during the $BCl_3$ gas supplying process, a hold period in which the exhaustion of the processing container 4 is temporarily suspended by closing the pressure adjusting valve 76 of the vacuum exhaustion system 72 while continuously performing the supply of the $BCl_3$ gas into the processing gas 4 may be interposed, such that the $BCl_3$ gas may be collected. A length of the hold period ($t_1$) (refer to FIG. 4(A)) is about 50 to 300% of the whole length of the $BCl_3$ gas supplying process, and the hold period may be interposed in a latter part of the supplying process. By interposing the hold period, an attaching amount of the $BCl_3$ gas on the surface of the wafer W is increased, thereby increasing a thickness of the formed BN film.

When the first process S1 is finished as described above, the second process S2 is performed. In the second process S2, in a state where the vacuum suction of the processing container 4 is performed, the DCS gas that is the silane-based gas, the $C_2H_4$ gas that is the hydrocarbon gas, and the $NH_3$ gas that is the nitriding gas are intermittently supplied in the stated order at different timings from each other. That is, each of the gases is intermittently supplied in a pulse form, and the DCS gas is supplied initially, the $C_2H_4$ gas is supplied next, and the $NH_3$ gas is supplied last, and the above supplying cycle is performed repeatedly. That is, one cycle refers to a period between the DCS gas supplying process in an arbitrary pulse form and a next DCS gas supplying process, and herein, the cycle is repeatedly performed a plurality of time, for example, y times (cycle), wherein y is an integer of 1 or greater.

In this case, between the DCS gas supplying process (refer to FIG. 4(C)) and the $C_2H_4$ gas supplying process (refer to FIG. 4(D)), between the $C_2H_4$ gas supplying process (refer to FIG. 4(D)) and the $NH_3$ gas supplying process (refer to FIG. 4(E)), and between the $NH_3$ gas supplying process (refer to FIG. 4(E)) and the DCS gas supplying process (refer to FIG. 4(C)), a pause period 90 in which the above-described purging process is performed is interposed so as to exhaust the remaining gas in the processing container 4. The purging process may be performed in the same manner as that of the purging process described above. During the DCS gas supplying process, DCS gas molecules are attached to the surface of the wafer W, $C_2H_4$ gas molecules are additionally attached to the surface of the wafer W in the $C_2H_4$ gas supplying process, and in the $NH_3$ gas supplying process, the $NH_3$ gas reacts with the DCS gas molecules and the $C_2H_4$ gas molecules attached on the surface of the wafer W to generate carbon-containing silicon nitride (SiCN). Then, when y cycles of the above process are repeatedly performed, a SiCN film 92 is formed.

An example of the processing condition at this time is as follows: A period T4 of the DCS gas supplying process is, for example, within a range of about 1 to 5 seconds, for example, about 3 seconds, a period T5 of the $C_2H_4$ gas supply process is, for example, within a range of about 1 to 5 seconds, for example, about 3 seconds, a period T6 of the $NH_3$ gas supplying process is, for example, within a range of about 15 to 30 seconds, for example, about 25 seconds, and a period of the pause period 90 in which the purging process is performed is, for example, about 1 to 10 seconds, for example, about 5 seconds. Here, by selecting a length of the period T5 of the $C_2H_4$ gas supplying process appropriately, an amount of carbon that affects wet-etching resistance may be controlled.

In addition, a flow rate of the DCS gas is about, for example, 500 to 2500 sccm, a flow rate of the $C_2H_4$ gas is about, for example, 2000 to 5000 sccm, and a flow rate of $NH_3$ gas is about, for example, 5000 to 10000 sccm. In addition, the processing temperature is in a range of about, for example, 500 to 700° C., like in the first process S1. In this case, if the processing temperature is lower than 500° C., the film forming reaction does not sufficiently occur, and moreover, a film forming rate is excessively low. In addition, if the processing temperature is higher than 700° C., various films formed on lower layers are degraded. Here, a more desirable processing temperature is in a range of 550 to 630° C.

When the second process S2 is finished as described above, it is determined whether a predetermined number of cycles, each including the first process S1 and the second process S2, for example, z cycles, are performed (S3). In addition, z is an integer of 1 or greater, for example, z may be 1. As a result of the determination, when the predetermined number of cycles z are not performed (NO to S3), the first process S1 and the second process S2 are repeatedly performed, and as shown in FIG. 5, the BN film 88 and the SiCN film 92 are alternately stacked. In addition, when the predetermined number of cycles z are performed (YES to S3), the film forming process is finished.

Accordingly, a SiBCN film 96 having a laminated structure is formed as shown in FIG. 5. In addition, although each of the DCS gas, the $C_2H_4$ gas, and the $NH_3$ gas is intermittently supplied in the stated order at different timings from each other, the present invention is not limited thereto. That is, the DCS gas is initially supplied, and at the same time, one of the $C_2H_4$ gas and the $NH_3$ gas may be supplied with the DCS gas. For example, when the $C_2H_4$ gas is supplied simultaneously with the DCS gas, the DCS gas and the $C_2H_4$ gas simultaneous supplying process and the $NH_3$ gas supplying process are performed alternately and intermittently in a pulse form.

The SiBCN film 96 formed through the above processes has a very small wet-etching rate with respect to, for example, diluted hydrogen fluoride, and thus, has a high wet-etching resistance, a low dielectric constant, and less leak current. A relative dielectric constant of the SiBCN film 96 of the laminated structure formed as described above is about, for example, from 4.5 and less than 7.0, and thus, a low dielectric constant may be obtained. In addition, the relative dielectric constant of the SiBCN film 96 may be much less than that of the conventional SiN film (relative dielectric constant: about 7.0).

As described above, according to the present invention, the film forming method forms a thin film including boron, nitrogen, silicon, and carbon on a surface of a processing target W by supplying a boron containing gas, a nitriding gas, a silane-based gas, and a hydrocarbon gas in the processing container 4 in which processing targets W are accommodated and vacuum suction may be performed. Thus, a low-k thin film (SiBCN film) including boron, nitrogen, silicon, and carbon may be formed, a wet-etching resistance may be improved, and leak current may be reduced.

Figure 6A:
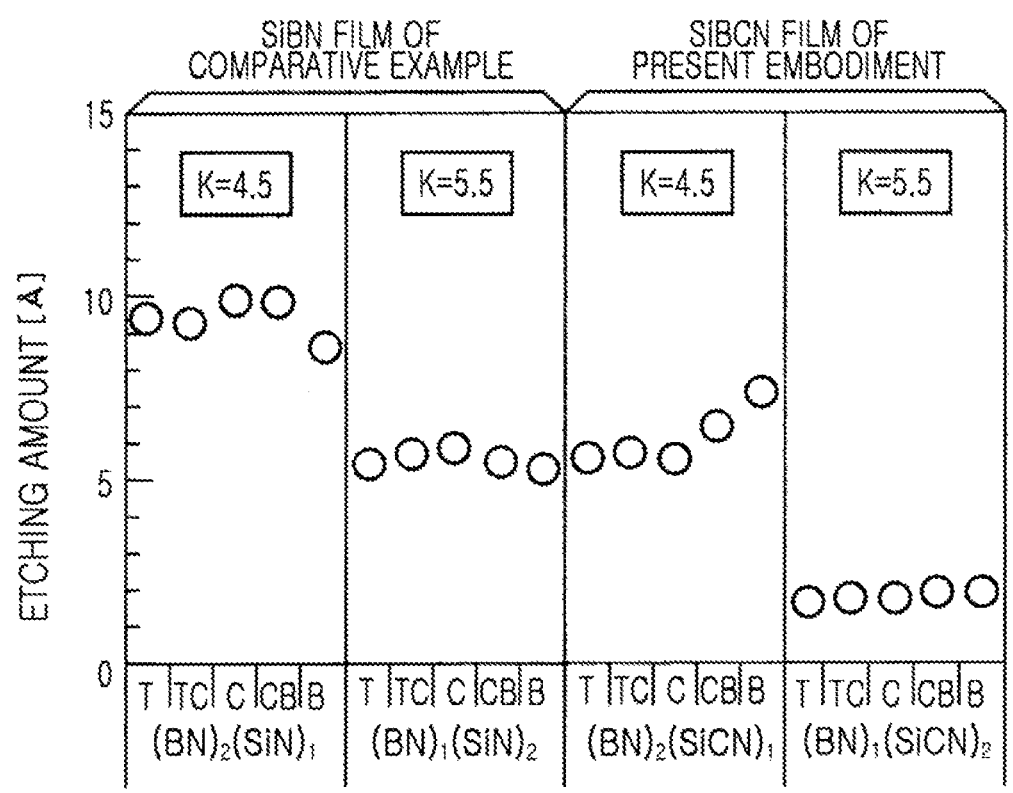
FIGS. 6A and 6B are graphs showing an etching amount, a relative dielectric constant, and a leak current of films with respect to a diluted hydrogen fluoride in each film.
Figure 6B:
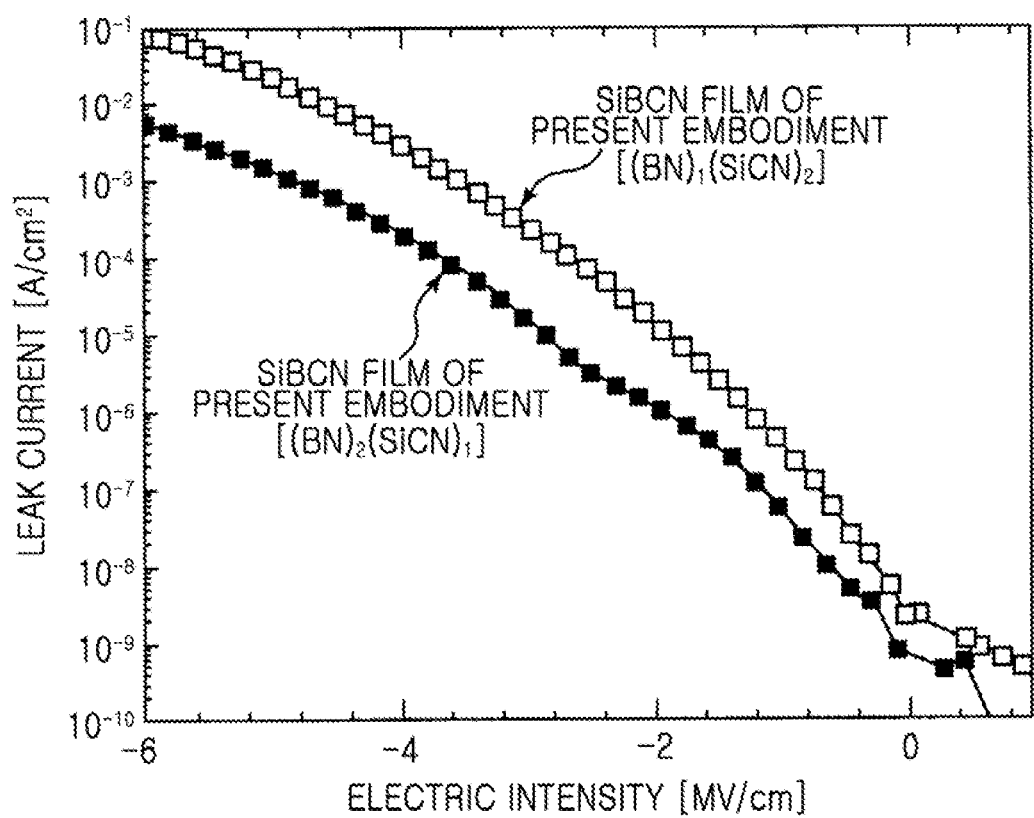

Evaluation of the Thin Film Formed by the Film Forming Method of the Present Invention Next, evaluation results of various characteristics of the SiBCN film 96 having the laminated structure formed by the above-described film forming method according to the present embodiment will be described with reference to FIGS. 6 and 7. Here, according to the first embodiment of the film forming method, the SiBCN film having the laminated structure was formed. In addition, as a comparative example, a SiBCN film having a laminated structure that does not contain carbon was formed without using a $C_2H_4$ gas, and various characteristics of the SiBCN films were measured. FIGS. 6A and 6B are graphs showing etching amounts, relative dielectric constants, and leak currents of the above-described films with respect to the diluted hydrogen fluoride, wherein FIG. 6A shows the etching amounts and the relative dielectric constants of the films and FIG. 6B shows a relation between an electric intensity and the leak current of each film.

FIG. 7 is a table showing film forming conditions according to the number of cycles when the SiBCN film is formed, and a relative evaluation of the characteristics. In FIG. 7, x and y denote the number of cycles. Here, as shown in FIG. 7, when the SiBCN film is formed, a case where the number of cycles x for forming the BN film in the first process S1 is 2 and the number of cycles y for forming the SiCN film in the second process S2 is 1, and a case where the number of cycles x for forming the BN film is 1 and the number of cycles y for forming the SiCN film in the second process S2 is 2 are represented.

In addition, the number z (refer to FIG. 3) of all cycles including the first and second processes S1 and S2 is 1. In addition, when the SiBN film of the comparative example was formed, the SiBN film of the comparative example was formed in the same manner as the SiBCN film of the first embodiment, except for not supplying the $C_2H_4$ gas. Therefore, as shown in FIG. 6A, a $(BN)_2(SiN)_1$ film and a $(BN)_1(SiN)_2$ film were used as comparative examples. In addition, the processing temperature was set as 630° C.

In FIG. 6A, the left half of the graph represents characteristics of the SiBN film that is the comparative example, and the right half of the graph represents characteristics of the SiBCN film according to the present embodiment. A transverse axis of FIG. 6A denotes a location of a wafer W in the height direction of the wafer boat 12, and the wafer boat 12 is divided into 5 zones in the height direction thereof, that is, T (top), TC (top center), C (center), CB (center bottom), and B (bottom) from an upper portion toward a lower portion. In addition, the relative dielectric constant of each of the films is denoted as K.

Herein, both of the films have the relative dielectric constant (K) of 4.5 and 5.5. That is, when the number of cycles x is 2 and the number of cycles y is 1, the relative dielectric constant (K) was 4.5, and when the number of cycles x is 1 and the number of cycles y is 2, the relative dielectric constant (K) was 5.5. Accordingly, it can be identified that an amount of the carbon C is irrelevant with the relative dielectric constant. In addition, since the relative dielectric constant is equal to 5 or less that is much lower than the relative dielectric constant 7.0 of the conventional insulating film, that is, the SiN film, a low-k insulating film may be obtained. In addition, when the relative dielectric constants (K) of the two films are the same, the SiBCN film according to the present embodiment has less etching amount and higher wet-etching resistance than those of the SiBN film according to the comparative example, and thus, the SiBCN film has superior characteristics to those of the comparative example.

In addition, when comparing the SiBCN films of the present embodiment with each other, the $(BN)_1(SiCN)_2$ film has less etching amount and higher wet-etching resistance than those of the $(BN)_2(SiCN)_1$ film. However, on the contrary, the $(BN)_2(SiCN)_1$ film has a lower relative dielectric constant than that of the $(BN)_1(SiCN)_2$ film. That is, both of the SiBCN films have excellent characteristics.

In addition, as shown in FIG. 6B, both of the films formed by the present embodiment have less leak current with respect to electric intensity, and show excellent evaluation results. In particular, the $(BN)_2(SiCN)_1$ film shows less leak current than that of the $(BN)_1(SiCN)_2$ film, and thus, has superior characteristics to those of the $(BN)_1(SiCN)_2$ film. As a result, both of the films formed by the present embodiment have excellent characteristics. Thus, when a relational equation of $1/2 \leq x/y \leq 2$ between the numbers of cycles (repeated number) x and y is satisfied, a SiBCN film having excellent characteristics may be obtained.

Evaluation of Temperature Dependence of Film Forming Rate

Figure 8:
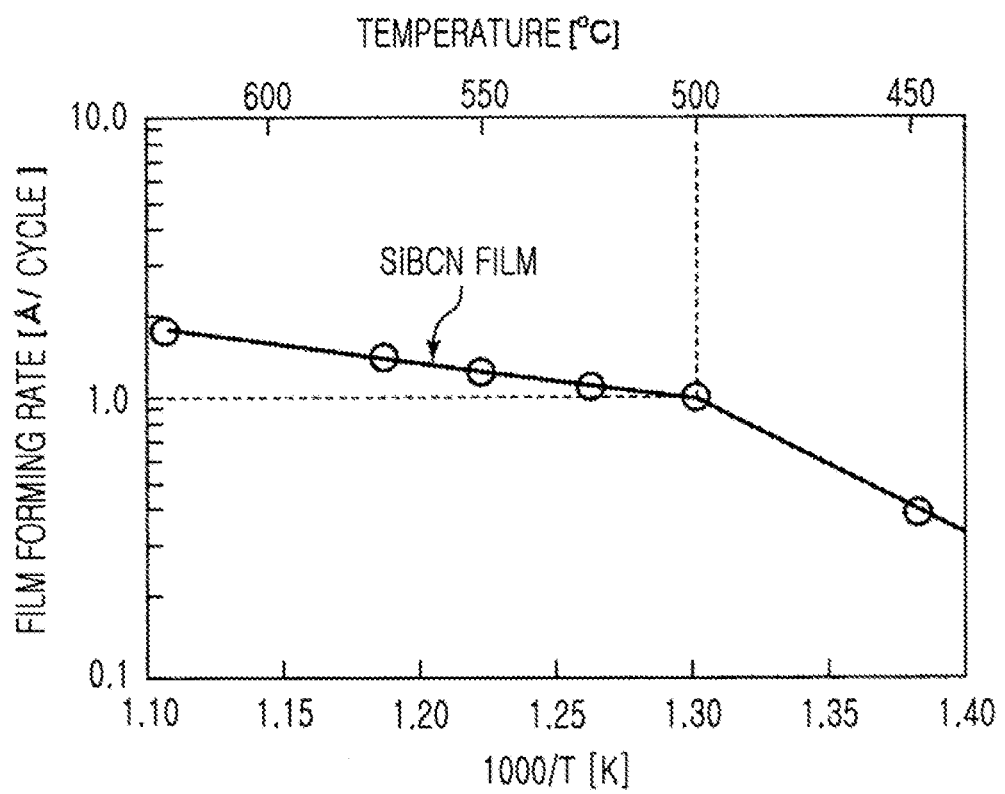
FIG. 8 is a graph showing a temperature dependence of a film forming rate.

Next, experimental results about temperature dependence of the film forming rate of the present embodiment are as follows: Here, a SiBCN film was formed by using the above-described film forming method while varying the processing temperature in a range of 450 to 650° C. FIG. 8 is a graph showing the temperature dependence of the film forming rate. In FIG. 8, a transverse axis denotes a film forming temperature (° C., 1000/T: T=273.1+° C.), and a longitudinal axis denotes a film forming rate of one cycle.

According to the graph of FIG. 8, the film forming rate at a processing temperature 650° C. is nearly 2 Å/cycle. However, as the processing temperature is lowered, the film forming rate is reduced gradually, and at a processing temperature of 500° C., the film forming rate is nearly 1.0 Å/cycle. Then, when the processing temperature is further lowered, the film forming rate is rapidly reduced, and at a processing temperature of 450° C., the film forming rate is reduced to nearly 0.4 Å/cycle. Here, since throughput is greatly reduced when the film forming rate is less than 1.0 Å/cycle, it is not desirable. Thus, the lowest limit of the processing temperature is 500° C., and more desirably, 550° C. or higher at which the film forming rate is about 1.3 Å/cycle or higher. In addition, when the processing temperature is lower than 500° C., the SiCN film is formed small and an occupying amount of the BN film in the SiBCN film is excessively large, thereby degrading film quality.

Second Embodiment

Figure 9:
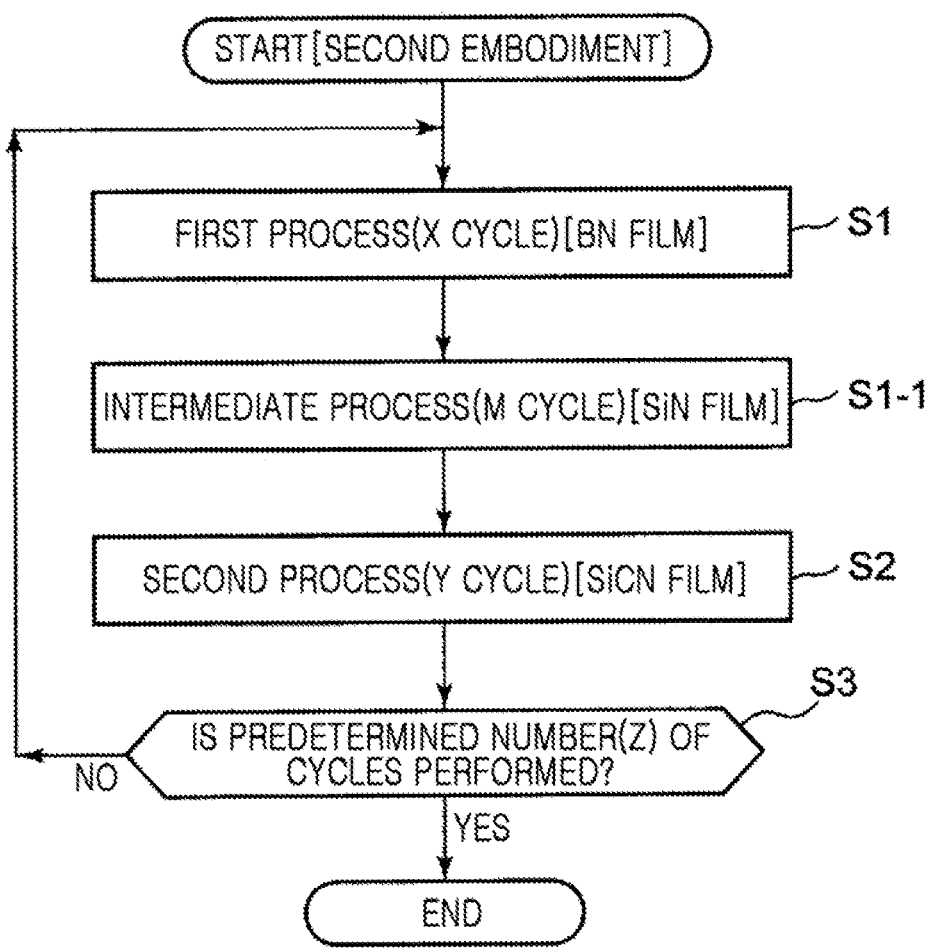
FIG. 9 is a flowchart showing a film forming method according to a second embodiment of the present invention.
Figure 10:
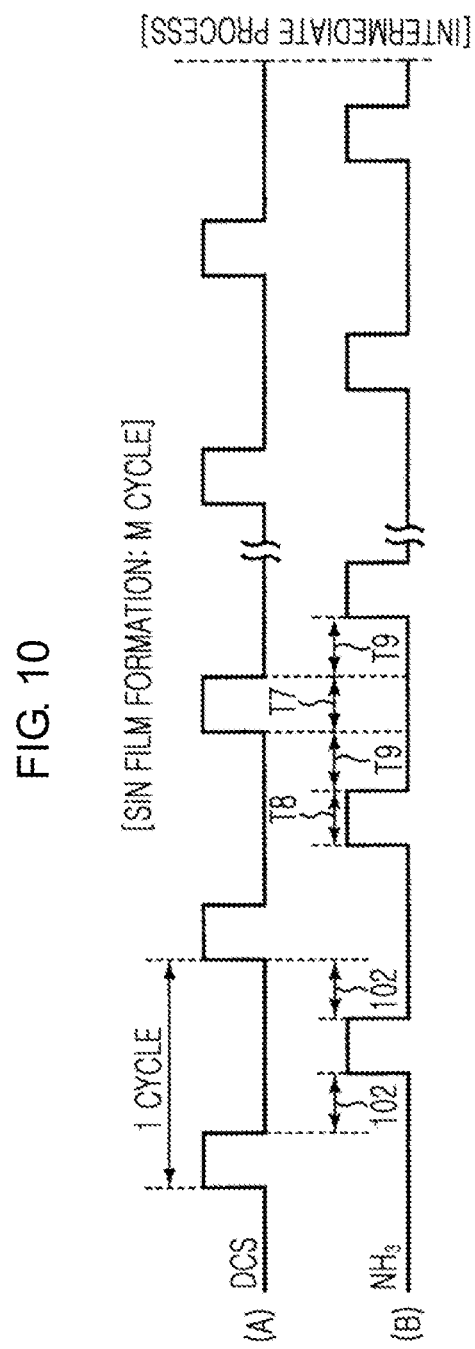
FIG. 10 is a timing chart showing timing of supplying various gases in intermediate processes of the film forming method according to the second embodiment of the present invention.
Figure 11:
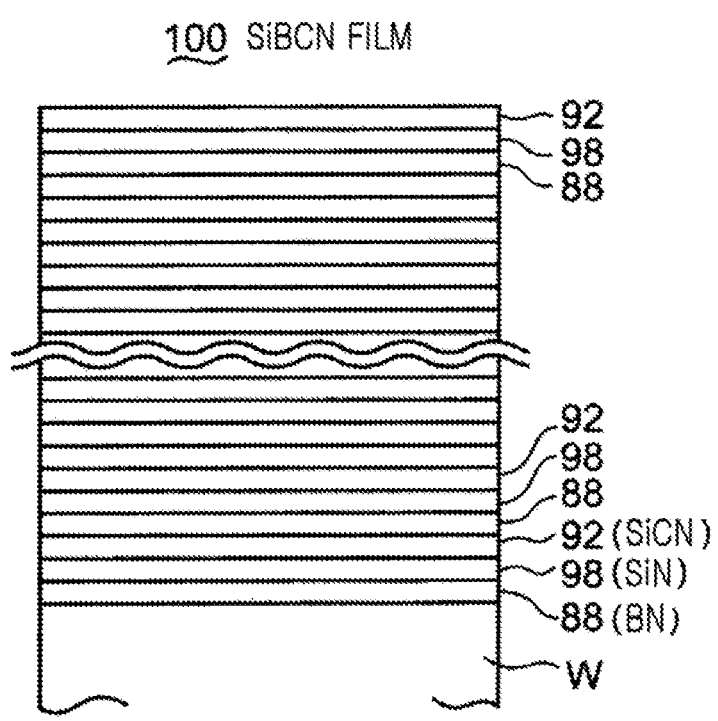
FIG. 11 is a cross-sectional view of a thin film having a laminated structure formed by the film forming method according to the second embodiment of the present invention.

Next, a second embodiment of the film forming method according to the present invention will be described. FIG. 9 is a flowchart showing a film forming method according to the second embodiment of the present invention, FIG. 10 is a timing chart showing timing of supplying various gases in an intermediate process in the film forming method according to the second embodiment of the present invention, and FIG. 11 is a cross-sectional view of a thin film having a laminated structure formed by the film forming method according to the second embodiment of the present invention. Like elements as those of FIGS. 3 through 5 are denoted by like reference numerals and descriptions thereof are not provided.

That is, according to the above-described film forming method of the second embodiment, the first process S1 is performed as shown in FIG. 3, and then, the second process S2 is performed. However, the present invention is not limited thereto, and an intermediate process S1-1 may be performed between the first process S1 and the second process S2, as shown in FIG. 9.

In the intermediate process S1-1, a cycle of alternately supplying the silane-based gas and the nitriding gas is performed once or more to form a SiN (silicon nitride) film. In more detail, as shown in FIG. 10, the DCS gas that is the silane-based gas (refer to FIG. 10(A)) and the $NH_3$ gas (refer to FIG. 10(B)) are alternately supplied in a pulse form, and then a SiN film 98 is formed. Thus, as shown in FIG. 11, a SiBCN film 96 having the laminated structure in which the BN film 88, the SiN film 98, and the SiCN film 92 are repeatedly laminated is formed.

In detail, in the intermediate process S1-1, in a state where the inside of the processing container 4 is vacuum sucked in advance, the DCS gas that is the silane-based gas and the $NH_3$ gas that is the nitriding gas are alternately and intermittently supplied to the processing container 4 in a pulse form. One cycle refers to a period between one DCS gas supplying process in an arbitrary pulse form and a next DCS gas supplying process, and in the present embodiment, a plurality of times, for example, m cycles, are repeatedly performed. Here, m is an integer of 1 or greater. As described above, a pause period 102 in which a purging process is performed is interposed between the DCS gas supplying process (refer to FIG. 10(A)) and the $NH_3$ gas supplying process (refer to FIG. 10(B)), and thus, remaining gas in the processing container 4 is exhausted by the purging process. The purging process may be performed by continuously performing the vacuum suction of the processing container 4 by using the vacuum exhaustion system 72 in a state where the supply of all gases is suspended, performing the vacuum suction of the processing container 4 while supplying a purge gas, or combining the above two ways.

DCS gas molecules are attached to the surface of the wafer W during the DCS gas supplying process, and when the $NH_3$ gas is supplied in the $NH_3$ gas supplying process, $NH_3$ reacts with the DCS gas molecules attached to the surface of the wafer W to generate SiN (silicon nitride). Then, the SiN film 98 is formed by repeatedly performing the m cycles.

An example of the processing condition at this time is as follows: A period T7 of the DCS gas supplying process is, for example, within a range of about 1 to 5 seconds, for example, about 3 seconds, a period T8 of the $NH_3$ gas supplying process is, for example, in a range of about 15 to 30 seconds, for example, about 25 seconds, and a period T9 of the pause period 102 in which the purging process is performed is, for example, about 1 to 10 seconds, for example, about 5 seconds.

In addition, a flow rate of the DCS gas is about, for example, 500 to 2500 sccm, and a flow rate of $NH_3$ gas is about, for example, 5000 to 10000 sccm. In addition, the processing temperature is in a range of about, for example, 500 to 700° C. In this case, if the processing temperature is lower than 500° C., the film forming reaction does not sufficiently occur, and moreover, a film forming rate is excessively low. In addition, if the processing temperature is higher than 700° C., various films formed on lower layers are degraded. Here, a more desirable processing temperature is in a range of 550 to 630° C.

In this case, the same operational effects as those of the first embodiment can be obtained. In particular, according to the present embodiment, the number of times of supplying the $C_2H_4$ gas that is the hydrocarbon gas is reduced. Thus, a density of carbon included in a film may be reduced, and an amount of contained carbon may be controlled precisely.

Also, in the above-described embodiments, when the $C_2H_4$ gas that is the hydrocarbon gas is supplied, a hold period, like in the supplying of the $BCl_3$ gas described with reference to FIG. 4(A), may be interposed so as to control the amount of carbon C contained in the film. Also, some or all of the purging processes performed in the above-described embodiments may be omitted.

Also, in the above embodiment, the $BCl_3$ gas is used as the boron-containing gas; however, the present invention is not limited thereto. That is, one or more gases selected from the group consisting of $BCl_3$, $B_2H_6$, $BF_3$, $B(CH_3)_3$, TEB, TDMAB, and TMAB may be used as the boron-containing gas.

In addition, in the above embodiments, the $NH_3$ gas is used as the nitriding gas; however, the present invention is not limited thereto. That is, one or more gases selected from the group consisting of the ammonia ($NH_3$), nitrogen ($N_2$), dinitrogen monoxide ($N_2O$), and nitrogen oxide (NO) can be used as the nitriding gas.

Also, in the above embodiments, the DCS gas is used as the silane-based gas; however, the present invention is not limited thereto. That is, one or more gases selected from the group consisting of the DCS, hexachlorodisilane (HCD), monosilane ($SiH_4$), disilane ($Si_2H_6$), hexamethyldisilazane (HMDS), tetrachlorosilane (TCS), disilylamine (DSA), trisilylamine (TSA), bis(tertiary-butylamino)silane (BTBAS), and diisopropylaminosilane (DIPAS) can be used as the silane-based gas.

Also, in the above embodiments, the $C_2H_4$ gas is used as the hydrocarbon gas; however, the present invention is not limited thereto. That is, one or more gases selected from the group consisting of acetylene, ethylene, methane, ethane, propane, and butane can be used as the hydrocarbon gas.

In addition, in the above embodiments, the semiconductor wafer is used as the processing target. However, the present invention is not limited thereto, and the semiconductor wafer may include a silicon substrate or a compound semiconductor substrate such as GaAs, SiC, or GaN. Moreover, the processing target may be a glass substrate, a ceramic substrate, or the like used in a liquid crystal display apparatus.

According to a film forming apparatus and a film forming method of the present invention, the following operational effects can be obtained:

According to the film forming method for forming a thin film including boron, nitrogen, silicon, and carbon on a surface of a processing target by supplying a boron-containing gas, a nitriding gas, a silane-based gas, and a hydrocarbon gas in a processing container in which the processing target is accommodated to be vacuum sucked, a low-k thin film (SiBCN film) including the boron, the nitrogen, the silicon, and the carbon may be formed, a wet-etching resistance can be improved, and leak current can be reduced.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A film forming method for forming a thin film including boron, nitrogen, silicon, and carbon on a surface of a processing target by supplying a boron containing gas, a nitriding gas, a silane-based gas, and a hydrocarbon gas in a processing container in which the processing target is accommodated to be in a vacuum, the film forming method comprising:
    a first process which forms a BN film by performing a cycle of alternately and intermittently supplying the boron-containing gas and the nitriding gas once or more; and
    a second process which forms a SiCN film by performing a cycle of intermittently supplying the silane-based gas, the hydrocarbon gas, and the nitriding gas once or more.

2. The film forming method of claim 1, wherein in the second process, the silane-based gas, the hydrocarbon gas, and the nitriding gas are supplied at different timings from each other.

3. The film forming method of claim 2, wherein in the second process, the silane-based gas is initially supplied before the hydrocarbon gas and the nitriding gas of the second process.

4. The film forming apparatus of claim 1, wherein in the second process, the silane-based gas is initially supplied, and at the same time, one of the hydrocarbon gas and the nitriding gas is supplied with the silane-based gas.

5. The film forming method of claim 1, wherein the first process comprises a hold period in which an exhaustion of the processing container is suspended while performing supply of the boron-containing gas.

6. The film forming method of claim 1, wherein a purging process for exhausting remaining gas in the processing container is performed between two supply processes adjacent in time of each gas.

7. The film forming method of claim 1, wherein the cycle including the first process and the second process is performed once or more.

8. The film forming method of claim 1, wherein an intermediate process which forms a SiN film by performing a cycle of alternately supplying the silane-based gas and the nitriding gas once or more is performed between the first process and the second process.

9. The film forming method of claim 1, wherein a processing temperature of each of the first and second processes is in a range of 500 to 700° C.

10. The film forming method of claim 1, wherein the number of cycles x in the first process and the number of cycles y in the second process satisfy a relational equation $1/2 \leq x/y \leq 2$.

11. The film forming method of claim 1, wherein the boron-containing gas is one or more gases selected from a group consisting of $BCl_3$, $B_2H_6$, $BF_3$, $B(CH_3)_3$, triethyl borate (TEB), Tri(dimethylamino)borane (TDMAB), and tetramethylammonium bromide (TMAB).

12. The film forming method of claim 1, wherein the nitriding gas is one or more gases selected from a group consisting of ammonia ($NH_3$), nitrogen ($N_2$), dinitrogen monoxide ($N_2O$), and nitrogen oxide (NO).

13. The film forming method of claim 1, wherein the silane-based gas is one or more gases selected from a group consisting of dichlorosilane (DCS), hexachlorodisilane (HCD), monosilane ($SiH_4$), disilane ($Si_2H_6$), hexamethyldisilazane (HMDS), tetrachlorosilane (TCS), disilylamine (DSA), trisilylamine (TSA), bis(tertiary-butylamino)silane (BTBAS), and diisopropylaminosilane (DIPAS).

14. The film forming method of claim 1, wherein the hydrocarbon gas is one or more gases selected from a group consisting of acetylene, ethylene, methane, ethane, propane, and butane.

* * * * *